United States Patent
Nathadi et al.

(10) Patent No.: US 11,026,033 B2
(45) Date of Patent: Jun. 1, 2021

(54) AUDIO COMPONENT ADJUSTING

(71) Applicant: HEWLETT-PACKARD DEVELOPMENT COMPANY, L.P., Spring, TX (US)

(72) Inventors: Raghotham Reddy Nathadi, Houston, TX (US); Wayne Park, Houston, TX (US); Kevin Richard Pare, Houston, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/479,973

(22) PCT Filed: Sep. 25, 2017

(86) PCT No.: PCT/US2017/053183
§ 371 (c)(1),
(2) Date: Jul. 23, 2019

(87) PCT Pub. No.: WO2019/059941
PCT Pub. Date: Mar. 28, 2019

(65) Prior Publication Data
US 2020/0213792 A1    Jul. 2, 2020

(51) Int. Cl.
*H04R 29/00* (2006.01)
*G10L 25/51* (2013.01)
*H03G 3/30* (2006.01)
*H04R 3/04* (2006.01)

(52) U.S. Cl.
CPC .......... *H04R 29/001* (2013.01); *G10L 25/51* (2013.01); *H03G 3/3005* (2013.01); *H04R 3/04* (2013.01); *H04R 29/004* (2013.01); *H03G 2201/103* (2013.01)

(58) Field of Classification Search
CPC ...... H04R 29/001; H04R 29/004; H04R 3/04; H03G 3/3005; H03G 2201/103; G10L 25/51
USPC ...................................................... 381/58, 59
See application file for complete search history.

(56) References Cited

U.S. PATENT DOCUMENTS

| | | | |
|---|---|---|---|
| 6,674,864 B1 | 1/2004 | Kitamura | |
| 6,766,176 B1 | 7/2004 | Gupta et al. | |
| 8,976,974 B2 | 3/2015 | Christoph et al. | |
| 2005/0244011 A1 | 11/2005 | Kim | |
| 2011/0064232 A1 | 3/2011 | Ruwisch | |
| 2011/0228945 A1* | 9/2011 | Mihelich | H04R 3/002 381/59 |
| 2012/0140936 A1* | 6/2012 | Bonnick | H04R 27/00 381/59 |
| 2013/0121505 A1 | 5/2013 | Duraiswami et al. | |

(Continued)

OTHER PUBLICATIONS

Tuning a Sound System, 2013.

*Primary Examiner* — Jason R Kurr
(74) *Attorney, Agent, or Firm* — HPI Patent Department

(57) ABSTRACT

Examples associated with audio component adjusting are described. One example includes storing a degradation for an audio component embedded in a device. A characteristic of the audio component is compared to the degradation model for the audio component. When the characteristic of the audio component indicates the audio component has reached a certain point on the degradation model, an attribute of the audio component is adjusted.

14 Claims, 5 Drawing Sheets

(56) References Cited

U.S. PATENT DOCUMENTS

| | | | |
|---|---|---|---|
| 2013/0329894 A1* | 12/2013 | Krishnaswamy | H03G 11/00 |
| | | | 381/55 |
| 2016/0057554 A1* | 2/2016 | Lavery | H04R 3/002 |
| | | | 381/58 |
| 2016/0277855 A1 | 9/2016 | Raz | |
| 2017/0006394 A1* | 1/2017 | Risberg | H04R 3/04 |
| 2017/0245079 A1* | 8/2017 | Sheen | H04R 9/046 |
| 2018/0122401 A1* | 5/2018 | Iyer | G10L 21/0264 |

* cited by examiner

AUDIO COMPONENT ADJUSTING

BACKGROUND

Many computing devices today come with built in audio components that serve a variety of purposes. Speakers are used to play audio from music, video, communications applications, games, and so forth. Microphones are used to receive audio input from users of the computing devices. In some examples, audio components may have a variety of attributes configured specifically for a device into which they are embedded.

BRIEF DESCRIPTION OF THE DRAWINGS

The present application may be more fully appreciated in connection with the following detailed description taken in conjunction with the accompanying drawings.

DETAILED DESCRIPTION

Systems, methods, and equivalents associated with audio component adjusting are, described. Because audio components often include moving parts, the audio components may age with time and/or become physically damaged as a result of a shock to a device containing the audio components. These events may result in the audio component not behaving in the same manner as when the audio component is initially installed in a device. Consequently, a degradation model may be included in a device containing the audio component, and the state of the audio component may be periodically compared to the degradation module. When the audio component is exhibiting wear, various attributes about the audio component may be adjusted, as described in the degradation model, to recalibrate the audio component to enhance the audio output of the audio component, and extend the effective life of the audio component before the audio component stops working.

Figure 1:
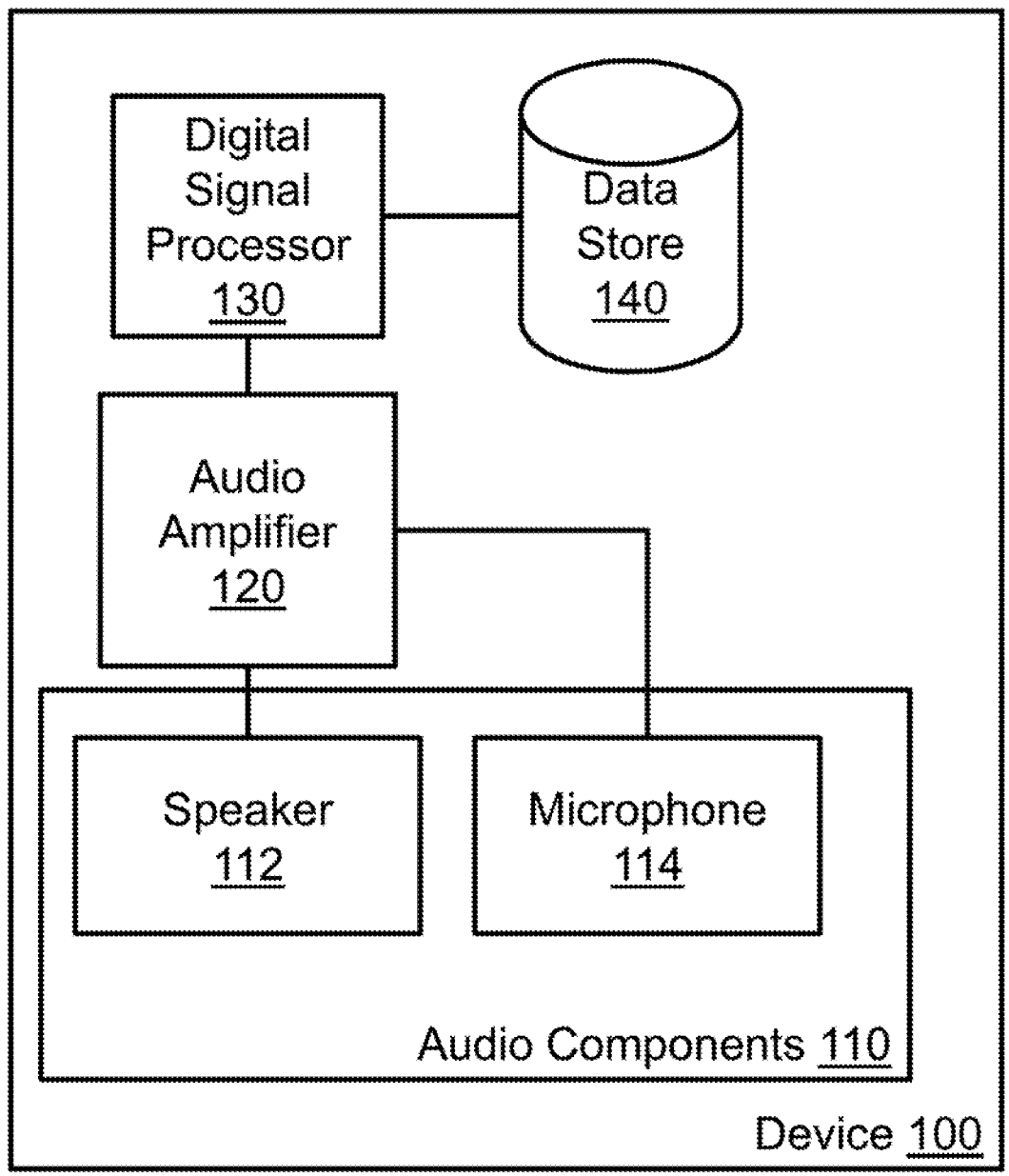
FIG. 1 illustrates an example device associated with audio component adjusting.

FIG. 1 illustrates an example device associated with audio component adjusting. It should be appreciated that the items, depicted in FIG. 1 are illustrative examples, and many different systems, devices, and so forth, may operate in accordance with various examples.

FIG. 1 illustrates an example device 100 associated with audio component adjusting. Device 100 includes several audio components 110 including speaker 112 and microphone 114. In various examples, speaker 112 and microphone 114 may be broadly used in many types of devices including device 100, designed specifically for device 100, and so forth. When audio components 110 are installed in device 100, various attributes of audio components 110 may be configured to optimize their operation based on the manner in which they are embedded in device 100 (e.g., based on location within device 100, expected use of device 100, and so forth). Generally, attributes of an audio component 110, as described herein, may be adjustable aspects of audio components 110 such as gain, frequency, response, and so forth.

Audio components 110 may wear or otherwise degrade over time. This may be due, for example, to degradation of electrical connections between audio components 110 and other components of device 100, wear on moving parts of audio components 110, and so forth. By way of illustration, some speakers 112 may work by applying an audio signal to a coil that causes the coil to move around a magnet, triggering a diaphragm attached to the coil to push air, thereby creating sound waves. Microphones 114 may operate based on similar principles in reverse to generate an audio signal from sound waves. Over time, these moving parts of audio components 110 may wear down from friction between the parts, and so forth, potentially reducing the quality of audio emitted and/or recorded by the audio components 110.

Thus, device 100 includes a data store 140 that may store a degradation model for audio components 110 including speaker 112 and/or microphone 114. The degradation model may describe various behaviors of audio components 110 as they are expected to degrade over time. These behaviors may be monitored by a digital signal processor 130 in concert with an audio amplifier 120.

Specifically, audio amplifier 120 may monitor various characteristics of audio components 110 over their life cycle and report those characteristics back to digital signal processor 130. The characteristics include detectible responses of audio components 110 to known signals such as, for example, current consumed by an audio component 110, voltage drop across an audio component 110, a sound pressure value generated by an audio component 110 in response to a known signal, and so forth. Digital signal processor may then compare those characteristics to the degradation model in data store 140. If certain milestones have been reached by the characteristics, digital signal processor 130 may effectively retune audio components 110 by adjusting various attributes of the audio components 110.

By way of illustration, a speaker 112 may be configured to operate at a first gain level when the speaker 112 is initially installed in device 100. Additionally, while the speaker 112 is operating optimally, it may produce a first pressure value in response to a known signal. Over time, speaker 112 may wear and the pressure value generated in response to the known signal may begin to change. When the pressure value reaches a known threshold according to the degradation module, digital signal processor 130 may adjust the gain to, a second gain level to enhance the sound quality delivered by the speaker.

It is appreciated that, in the following description, numerous specific details are set forth to provide a thorough understanding of the examples. However, it is appreciated that the examples may be practiced without limitation to these specific details. In other instances, methods and structures may not be described in detail to avoid unnecessarily obscuring the description of the examples. Also, the examples may be used in combination with each other.

"Module", as used herein, includes but is not limited to hardware, firmware, software stored on a computer-readable medium or in execution on a machine, and/or combinations of each to perform a function(s) Of an action(s), and/or to cause a function or action from another module, method, and/or system. A module may include a software controlled microprocessor, a discrete module, an analog circuit, a digital circuit, a programmed module device, a memory device containing instructions, and so on. Modules may include gates, combinations of gates, or other circuit components. Where multiple logical modules are described, it may be possible to incorporate the multiple logical modules into one physical module. Similarly, where a single logical module is described, it may be possible to distribute that single logical module between multiple physical modules.

Figure 2:
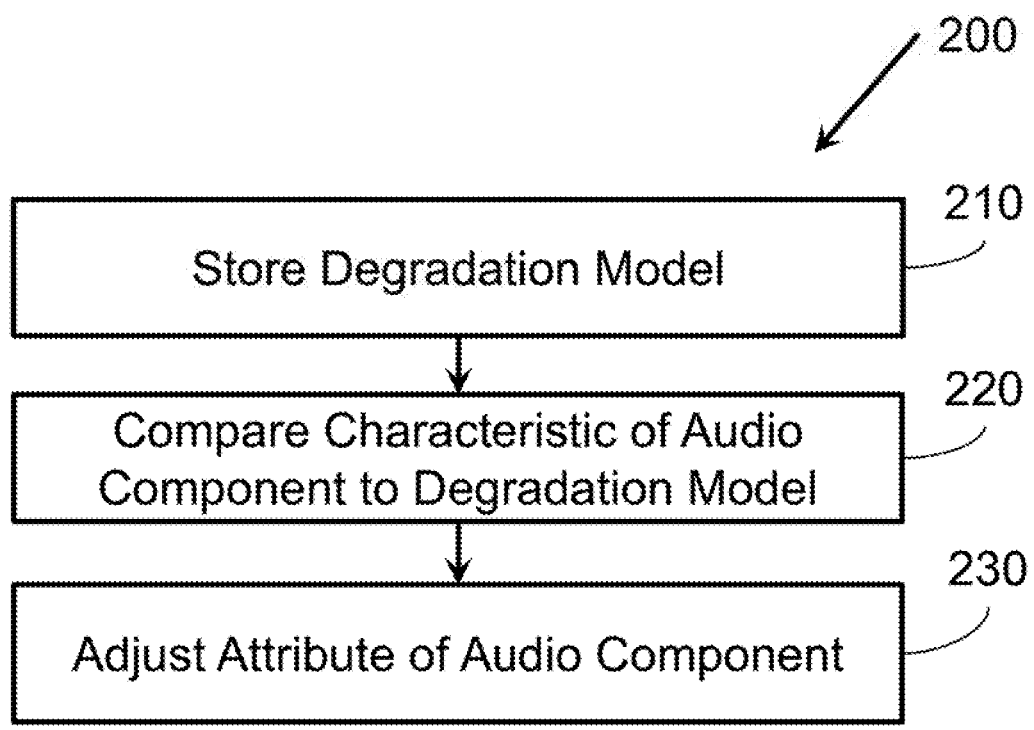
FIG. 2 illustrates a flowchart of example operations associated with audio component adjusting.

FIG. 2 illustrates an example method 200. Method 200 may be embodied on a non-transitory processor-readable medium storing processor-executable instructions. The instructions, when executed by a processor, may cause the processor to perform method 200. In other examples, method 200 may exist within logic gates and/or RAM of an application specific integrated circuit (ASIC).

Method 200 may perform various tasks associated with audio component adjusting. Method 200 includes storing a degradation model for an audio component at 210. The degradation model may be stored in a device. The audio component may be embedded in the device. The audio component may be, for example, a speaker, a microphone, and so forth. The device may be, for example, a mobile device, a laptop, a computer, a standalone device whose primary function is related to the audio component, and so forth.

Method 200 also includes comparing a characteristic of the audio component to the degradation model for the audio component at 220. The characteristic of the audio component may be, for example, a current consumed by the audio component, a voltage drop across the audio component, a sound pressure value generated by the audio component in response to a known signal, and so forth.

Method 200 also include adjusting an attribute of the audio component at 230. The attribute of the audio component may be adjusted when the characteristic of the audio component indicates the audio component has reached a certain point on the degradation model. The attribute may be, for example, gain, frequency, response, and so forth.

Figure 3:
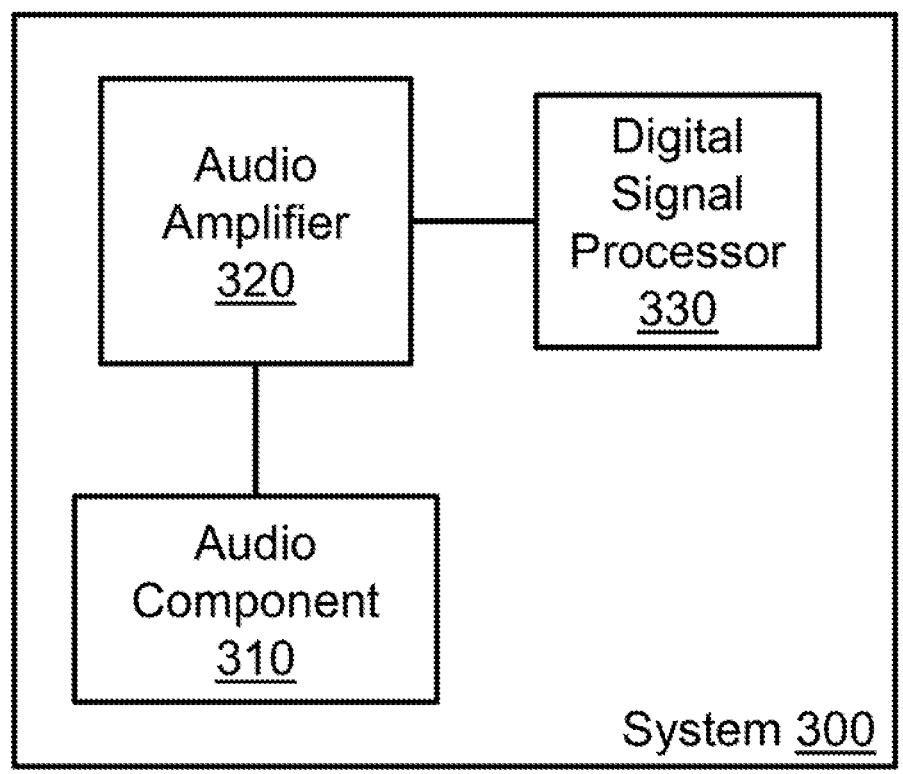
FIG. 3 illustrates an example system associated with audio component adjusting.

FIG. 3 illustrates an example system 300 associated with audio component adjusting. System 300 includes an audio component 310. The audio component may be, for example, a microphone, a speaker, and so forth.

System 300 also includes an audio amplifier 320. Audio amplifier 320 may read a set of characteristics of audio component 310. The set of characteristics may include, for example, a current consumed by audio component 310, a voltage drop across audio component 310, a sound pressure value generated by audio component 310 in response to a known signal, and so forth.

System 300 also includes a digital signal processor 330. Digital signal processor 330 may compare the set of characteristics of audio component 310 to a degradation model for audio component 310. Digital signal processor 330 may also adjust an attribute of audio component 310 to extend the operational life of audio component 310. The attribute may be, for example, gain, frequency, response, and so forth.

In some examples, system 300 may include data store (not shown). The data store may store the degradation model for audio component 310. The data store may also store historical values for the set of characteristics of audio component 310. In this example, digital signal processor 330 may also adjust the attribute of audio component 310 based on the historical values.

Figure 4:
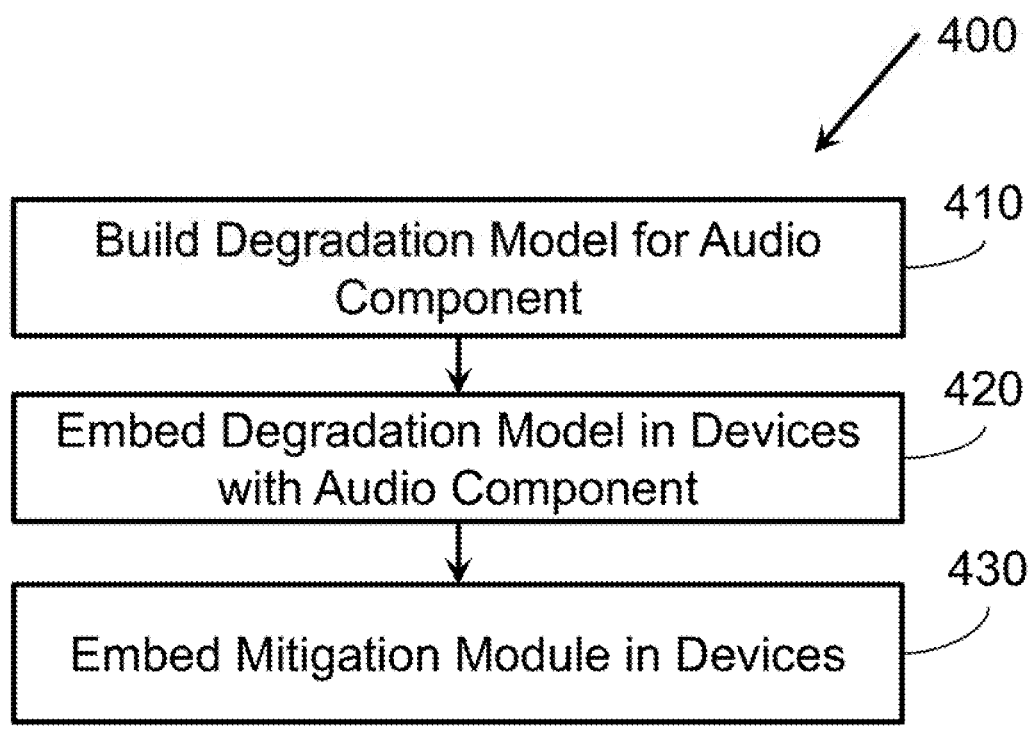
FIG. 4 illustrates another a flowchart of example operations associated with audio component adjusting.

FIG. 4 illustrates a method 400. Method 400 includes building a degradation model for an audio component at 410. The degradation model may describe how the audio component is expected to behave as it demonstrates wear over an expected life cycle of the audio component. The degradation model may also describe how to adjust attributes of the audio component to retain operational effectiveness once the audio component begins demonstrating the wear, in some examples, the degradation model may also describe how the audio component is expected to behave after physical damage to the audio component. In these examples, the degradation model may also describe how to adjust the audio component to retain operational effectiveness when the audio component demonstrates the physical damage.

Method 400 also includes embedding the degradation model in devices manufactured with the audio component at 420. In some examples, the degradation model for the audio component may be built specific to the device into which the audio component is embedded. This may be desirable when characteristics for the audio device are configured specifically for the device into which the audio device is embedded to allow optimization of a standardized audio device for a variety of situations. By way of illustration, a single model of speaker or microphone may be used across a wide variety of products having different physical structures and/or layouts, making it desirable to optimize the speaker or microphone and/or build a degradation model for the different products.

At 430, method 400 includes embedding a mitigation module in the devices. The mitigation module may read characteristics of a respective audio component, compare the characteristics to the degradation model, and adjust the attributes of the respective audio component based on the degradation model. The characteristics may include, for example, a current consumed by the audio component, a voltage drop across the audio component, a sound pressure value generated by the audio component in response to a known signal, and so forth.

Figure 5:
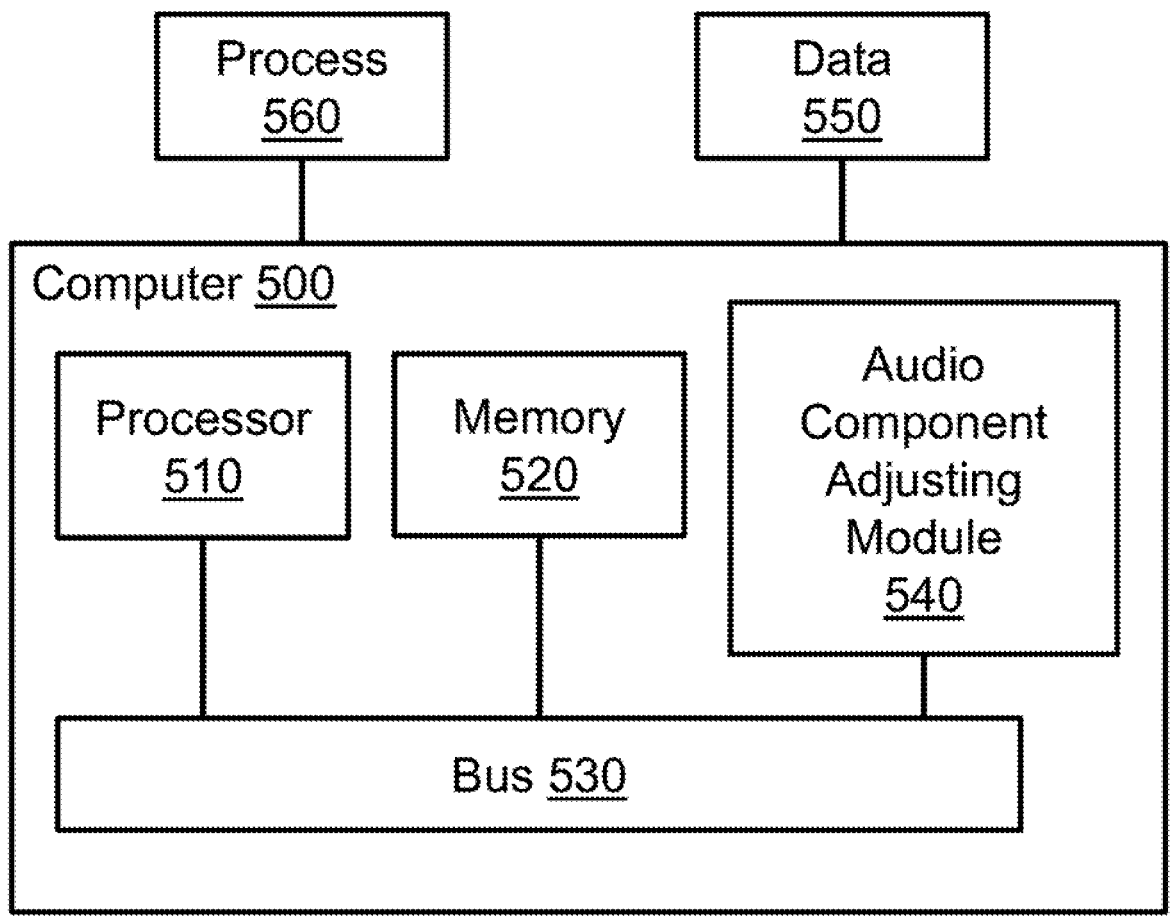
FIG. 5 illustrates an example computing device in which example systems, and methods, and equivalents, may operate.

FIG. 5 illustrates an example computing device in which example systems and methods, and equivalents, may operate. The example computing device may be a computer 500 that includes a processor 510 and a memory 520 connected by a bus 530. Computer 500 includes a audio component adjusting module 540. Audio component adjusting module 540 may perform, alone or in combination, various functions described above with reference to the example systems, methods, and so forth. In different examples, audio component adjusting module 540 may be implemented as a non-transitory computer-readable medium storing processor-executable instructions, in hardware, software, firmware, an application specific integrated circuit, and/or combinations thereof.

The instructions may also be presented to computer 500 as data 550 and/or process 560 that are temporarily stored in memory 520 and then executed by processor 510. The processor 510 may be a variety of processors including dual microprocessor and other multi-processor architectures. Memory 520 may include non-volatile memory (e.g., read-only memory) and/or volatile memory (e.g., random access memory). Memory 520 may also be, for example, a magnetic disk drive, a solid state disk drive, a floppy disk drive, a tape drive, a flash memory card, an optical disk, and so on. Thus, memory 520 may store process 560 and/or data 550. Computer 500 may also be associated with other devices including other computers, devices, peripherals, and so forth in numerous configurations (not shown).

It is appreciated that the previous description of the disclosed examples s provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

What is claimed is:

1. A method, comprising:
   storing, in a device, a degradation model for an audio component embedded in the device, wherein the degradation model describes behavior of the audio component as the audio component wears over a life cycle of the audio component;
   comparing a characteristic of the audio component to the degradation model for the audio component, wherein the characteristic is a sound pressure value generated in response to a known signal; and
   adjusting an attribute of the audio component when the characteristic of the audio component indicates the audio component has reached a certain point on the degradation model.

2. The method of claim 1, where the audio component is one, of a speaker and a microphone.

3. The method of claim 1, where the characteristic of the audio component further includes a current consumed by the audio component.

4. The method of claim 1, where the characteristic of the audio component further includes a voltage drop across the audio component.

5. The method of claim 1, where the attribute of the audio component is one of gain and frequency.

6. A system, comprising:
   an audio component;
   an audio amplifier to read a set of characteristics of the audio component; and
   a digital signal processor to:
      compare the set of characteristics of the audio component to a degradation model for the audio component, wherein:
         the degradation model describes behavior of the audio component as the audio component wears over a life cycle of the audio component; and
         the set of characteristics include a sound pressure value generated in response to a known signal; and
      adjust an attribute of the audio component to extend the operational life of the audio component based on the degradation model.

7. The system of claim 6, the audio component is one of a microphone and a speaker.

8. The system of claim 6, where the set of characteristics further include at least one of a current consumed by the audio component and a voltage drop across the audio component.

9. The system of claim 6, where the attribute of the audio component is one of gain and frequency.

10. The system of claim 6, comprising a data store to store the degradation model for the audio component and historical values for the set of characteristics of the audio component, and where the digital signal processor also adjusts the attribute of the audio component based on the historical values.

11. A method, comprising:
    building a degradation model for an audio component describing:
       behavior of the audio component as the audio component wears over a life cycle of the audio component; and
       how to adjust attributes of the audio component to retain operational effectiveness when the audio component demonstrates the wear;
    embedding the degradation model in devices manufactured with the audio component; and
    embedding a mitigation module in the devices, where the mitigation module is to:
       read characteristics of a respective audio component, wherein the characteristics include a sound pressure value generated by the respective audio component in response to a known signal;
       compare the characteristics to the degradation model; and
       adjust the attributes of the respective audio component based on the degradation model.

12. The method of claim 11, where the degradation model also describes how the audio component is expected to behave after physical damage to the audio component, and how to adjust the audio component to retain operational effectiveness when the audio component demonstrates the physical damage.

13. The method of claim 11, where the degradation model for the audio component is built specific to the device into which the audio component is embedded.

14. The method of claim 11, where the characteristics further include at least one of a current consumed by the audio component and a voltage drop across the audio component.

* * * * *